United States Patent
Hornstein et al.

(10) Patent No.: US 9,490,688 B2
(45) Date of Patent: Nov. 8, 2016

(54) METHOD AND CIRCUIT ARRANGEMENT FOR SWITCHING A SEMICONDUCTOR SWITCH

(71) Applicant: Conti Temic microelectronic GmbH, Nuremberg (DE)

(72) Inventors: Christoph Hornstein, Nuremberg (DE); Ulrich Bley, Rackwitz (DE); Kai Kuehnen, Nuremberg (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 0 days.

(21) Appl. No.: 14/399,249

(22) PCT Filed: Oct. 15, 2013

(86) PCT No.: PCT/EP2013/071519
§ 371 (c)(1),
(2) Date: Nov. 6, 2014

(87) PCT Pub. No.: WO2014/063959
PCT Pub. Date: May 1, 2014

(65) Prior Publication Data
US 2015/0222174 A1    Aug. 6, 2015

(30) Foreign Application Priority Data
Oct. 22, 2012    (DE) .......................... 10 2012 219 248

(51) Int. Cl.
*H02P 6/14*    (2016.01)
*H02M 1/08*    (2006.01)
(Continued)

(52) U.S. Cl.
CPC ............... *H02M 1/08* (2013.01); *H02P 27/04* (2013.01); *H03K 4/02* (2013.01); *H03K 17/163* (2013.01);
(Continued)

(58) Field of Classification Search
CPC    H05B 33/0815; H02M 1/08; H02M 1/0054; H02P 27/04
See application file for complete search history.

(56) References Cited

U.S. PATENT DOCUMENTS 5,017,802 A    5/1991    Feldtkeller .................... 327/109
6,069,509 A *  5/2000    Labram ............ H03K 19/00361
                                                        134/112

(Continued)

FOREIGN PATENT DOCUMENTS

CN    102158211 A    8/2011    ........... H03K 17/567
DE    19855604 C1    6/2000    ........... H03K 17/042

(Continued)

OTHER PUBLICATIONS

International Search Report and Written Opinion, Application No. PCT/EP2013/071519, 14 pages, Feb. 13, 2014.

(Continued)

*Primary Examiner* — Karen Masih
(74) *Attorney, Agent, or Firm* — Slayden Grubert Beard PLLC

(57) ABSTRACT

A method is disclosed for switching a semiconductor switch from a first static switch state to a second static switch state by controlling a control connection of the semiconductor switch. The method includes switching the semiconductor switch in a current-controlled manner starting from the first static switch state in a first switching phase by applying at least one first specified actuating current at the control connection of the semiconductor switch in a controlled manner, and switching the semiconductor switch in a voltage-controlled manner in a second switching phase following the first switching phase by applying at least one first specified actuating voltage to the control connection of the semiconductor switch in a controlled manner until the second static switch state is reached. In this manner, switching losses are reduced.

13 Claims, 3 Drawing Sheets

(51) Int. Cl.
*H03K 4/02* (2006.01)
*H03K 19/003* (2006.01)
*H03K 17/16* (2006.01)
*H02P 27/04* (2016.01)
*H02M 1/00* (2006.01)

(52) U.S. Cl.
CPC .......... *H03K 17/168* (2013.01); *H03K 19/003* (2013.01); *H02M 2001/0054* (2013.01); *H03K 2217/0036* (2013.01); *Y10T 307/977* (2015.04)

(56) References Cited

U.S. PATENT DOCUMENTS 6,556,407 B2  4/2003  Brando et al. ................ 361/100
2011/0241738 A1  10/2011  Tamaoka ...................... 327/109
2012/0206123 A1  8/2012  Mulligan et al. ............. 323/313

FOREIGN PATENT DOCUMENTS

EP  0314013 A1  5/1989  ............... H02K 3/00
EP  2009792 A2  12/2008  ............. H03K 17/04
WO  2014/063959 A1  5/2014  ........... H03K 17/567

OTHER PUBLICATIONS

European Office Action, Application 13777047.5, 9 pages, Oct. 6, 2015.
Chinese Office Action, Application No. 201380024968.1, 14 pages, May 18, 2016.

* cited by examiner

METHOD AND CIRCUIT ARRANGEMENT FOR SWITCHING A SEMICONDUCTOR SWITCH

CROSS-REFERENCE TO RELATED APPLICATIONS

This application is a U.S. National Stage Application of International Application No. PCT/EP2013/071519 filed Oct. 15, 2013, which designates the United States of America, and claims priority to DE Application No. 10 2012 219 248.4 filed Oct. 22, 2012, the contents of which are hereby incorporated by reference in their entirety.

TECHNICAL FIELD

The invention relates to a method and a circuit arrangement for switching a semiconductor switch. In addition, the invention relates to a power converter comprising such a circuit arrangement and a drive apparatus comprising such a power converter.

BACKGROUND

Power converters, in particular power converters of a drive arrangement of an electric or hybrid vehicle, comprise semiconductor switches, in particular power semiconductor switches such as, for example, power IGBTs (power insulated-gate bipolar transistors), which generate switching losses during operation of the power converter. These switching losses result in a development of heat at the semiconductor switches which impairs the operation of the semiconductor switches.

SUMMARY

One embodiment provides a method for switching a semiconductor switch from a first steady-state switching state to a second steady-state switching state by controlling a control connection of the semiconductor switch, wherein the method has the following method steps: current-controlled switching of the semiconductor switch starting from the first steady-state switching state in a first switching phase by impressing, in a controlled manner, at least one first, predetermined actuation current at the control connection of the semiconductor switch, and voltage-controlled switching of the semiconductor switch in a second switching phase, which follows the first switching phase, by controlled application of at least one first, predetermined actuation voltage at the control connection of the semiconductor switch until the second steady-state switching state has been reached.

In a further embodiment, the first steady-state switching state is an open switching state of the semiconductor switch, and the second steady-state switching state is a closed switching state of the semiconductor switch, or the first steady-state switching state is a closed switching state of the semiconductor switch and the second steady-state switching state is an open switching state of the semiconductor switch, wherein the semiconductor switch is on in the closed switching state, and is off in the open switching state.

In a further embodiment, in a first switching operation of the semiconductor switch from the open switching state to the closed switching state, a transition from the first switching phase to the second switching phase takes place depending on a first voltage, which is present between an input current connection and an output current connection of the semiconductor switch or on a parameter characterizing the first voltage.

In a further embodiment, in a second switching operation of the semiconductor switch from the closed switching state to the open switching state, a transition from the first switching phase to the second switching phase takes place depending on a second voltage, which is present between the control connection and the output current connection of the semiconductor switch or on a parameter characterizing the second voltage.

In a further embodiment, the semiconductor switch is switched in a controlled manner to the open steady-state switching state by switching on a first controllable driver switch, wherein the first driver switch: is switched on in current-controlled fashion in the first switching phase of the semiconductor switch by the at least one first actuation current, and is switched on in voltage-controlled fashion in the second switching phase of the semiconductor switch by the at least one first actuation voltage.

In a further embodiment, the semiconductor switch is switched in controlled fashion to the closed steady-state switching state by switching on a second controllable driver switch, wherein the second driver switch: is switched on in current-controlled fashion in the first switching phase of the semiconductor switch by at least one third, predetermined actuation current, and is switched on in voltage-controlled fashion in the second switching phase of the semiconductor switch by at least one second, predetermined actuation voltage.

In a further embodiment, the method includes switching-on of the first driver switch by the at least one first actuation voltage in the event of the presence of a first signal edge or of a first signal level of the control signal for switching the semiconductor switch into the open switching state, and in the event that the second reference voltage is undershot by the second voltage.

In a further embodiment, the method includes switching-on of the second driver switch by the second actuation voltage in the event of the presence of a second signal edge or of a second signal level of the control signal for switching the semiconductor switch into the closed switching state, and in the event that the first reference voltage is undershot by the first voltage.

In a further embodiment, the method includes switching-on of the first driver switch by the at least one first actuation current in the event of the presence of the first signal edge or the first signal level of the control signal, in the event that the second reference voltage is overshot by the second voltage, and as long as the first voltage undershoots the first reference voltage.

In a further embodiment, the method includes switching-on of the first driver switch by a second, predetermined actuation current which is different, in particular lower, than the at least one first actuation current in the event of the presence of the first signal edge or the first signal level of the control signal, in the event that the first reference voltage is overshot by the first voltage, and as long as the second voltage does not undershoot the second reference voltage.

In a further embodiment, the method includes switching-on of the second driver switch by the at least one third actuation current in the event of the presence of the second signal edge or the second signal level of the control signal, in the event that the first reference voltage is overshot by the first voltage, and as long as the second voltage undershoots the second reference voltage.

In a further embodiment, the method includes switching-on of the second driver switch by a fourth, predetermined actuation current which is different, in particular lower, than the at least one third actuation current in the event of the presence of the second signal edge or the second signal level of the control signal, in the event that the second reference voltage is overshot by the second voltage, and as long as the first voltage does not undershoot the first reference voltage.

Another embodiment provides a circuit arrangement for switching a semiconductor switch controllable via a control connection from a first steady-state switching state to a second steady-state switching state by controlling the control connection of the semiconductor switch, wherein the circuit arrangement is designed to switch the semiconductor switch in current-controlled fashion starting from the first steady-state switching state in a first switching phase by impressing, in controlled fashion, at least one first, predetermined actuation current at the control connection of the semiconductor switch, and in voltage-controlled fashion in a second switching phase following the first switching phase by applying, in controlled fashion, at least one first, predetermined actuation voltage at the control connection of the semiconductor switch until the second steady-state switching state has been reached.

Another embodiment provides a power converter for providing at least one phase current for an electric machine comprising at least one semiconductor switch, wherein the power converter has at least one circuit arrangement as disclosed above for switching the at least one semiconductor switch.

Another embodiment provides a drive apparatus for driving a vehicle comprising an electric machine, wherein the drive apparatus has a power converter comprising at least one semiconductor switch for providing at least one phase current for the electric machine and at least one circuit arrangement as disclosed above for switching the at least one semiconductor switch.

BRIEF DESCRIPTION OF THE DRAWINGS

Example embodiments of the invention are explained in more detail below with reference to the attached drawings, in which.

DETAILED DESCRIPTION

Figure 1:
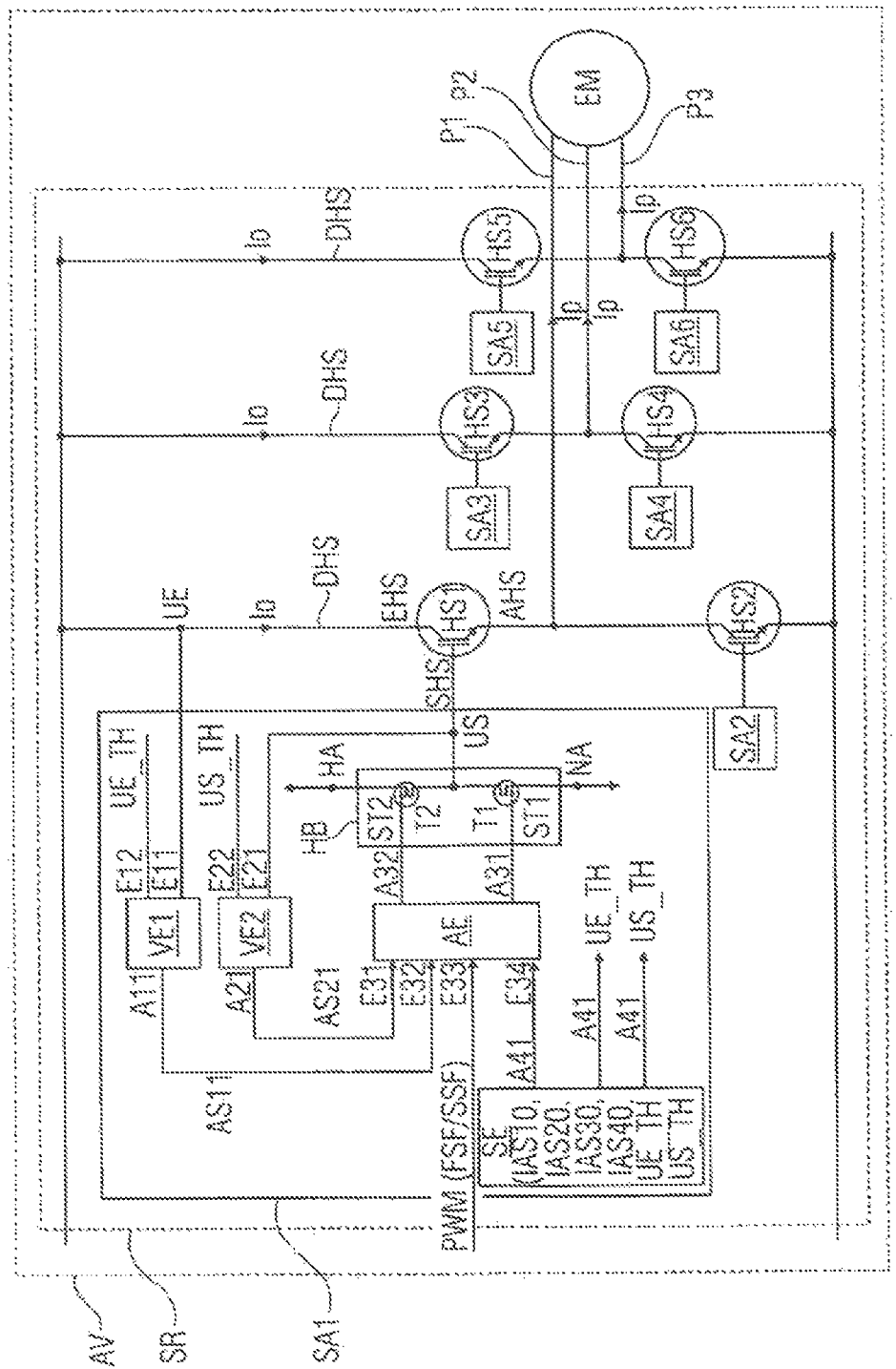
FIG. 1 shows a schematic illustration of a drive apparatus for explaining a power converter including six circuit arrangements in accordance with one embodiment of the invention in a circuit diagram.

Embodiments of the present invention therefore provide a method and circuit arrangement for switching semiconductor switches with low switching losses.

Some embodiments provide a method for switching a semiconductor switch, in particular a power IGBT, from a first steady-state switching state to a second steady-state switching state by controlling a control connection of the semiconductor switch is provided, comprising current-controlled switching of the semiconductor switch starting from the first steady-state switching state in a first switching phase by impressing, in a controlled manner, at least one first, predetermined actuation current at the control connection of the semiconductor switch, and voltage-controlled switching of the semiconductor switch in a second switching phase, which follows the first switching phase, by controlled application of at least one first, predetermined actuation voltage at the control connection of the semiconductor switch until the second steady-state switching state has been reached.

Accordingly, the semiconductor switch, starting from the first steady-state switching state in which said semiconductor switch is located prior to switching, is switched in current-controlled fashion in a first switching phase by impressing, in controlled fashion, at least one first, predetermined actuation current at the control connection of the semiconductor switch. In a second switching phase following this first switching phase, the semiconductor switch is switched in voltage-controlled fashion by applying, in controlled fashion, at least one first, predetermined actuation voltage at the control connection of the semiconductor switch until the second steady-state switching state, which deviates from the first switching state, has been reached.

In this case, the term "switching" means a controlled transition from a first steady-state switching state to a second steady-state switching state of the semiconductor switch.

The term "impressing" means introducing a controlled current from or to the control connection of the semiconductor switch with a current intensity which is set to a constant current value. By impressing, in controlled fashion, the at least one first preset actuation current in the first switching phase, the capacitance at the control connection of the semiconductor switch is subjected to charge reversal, i.e. charged or discharged.

By virtue of the controlled application of the at least one first preset actuation voltage at the control connection of the semiconductor switch in the second switching phase, the control connection of the semiconductor switch is connected to a preset voltage potential until the capacitance at the control connection of the semiconductor switch has been subjected to complete charge reversal, i.e. has been completely charged or discharged, and therefore the second steady-state switching state has been reached.

The first and second switching phases are two temporally successive switching steps in a transition of the semiconductor switch from the first steady-state switching state to the second steady-state switching state which deviates from the first switching state.

The abovementioned method provides a possibility of switching the semiconductor switch, wherein the switching losses in the semiconductor switch can be markedly reduced. In addition, the switching duration is shortened, which in turn reduces delay times and disruptive dead times between the switching operations of the semiconductor switch.

In addition, event-controlled switching of the semiconductor switch is implemented by the method. Therefore, a time measurement required in the case of time-controlled switching and the circuit components required for the time measurement can be dispensed with.

By virtue of the voltage-controlled switching in the second switching phase until the desired steady-state switching state has been reached, further switching phases can also be dispensed with. In addition, by virtue of the omission of the configuration requirements for further parameters for the otherwise required actuation variables, the programming duration can therefore be reduced to the clock time in the production of the circuit arrangement.

Since, in the entire switching operation of the semiconductor switch, only an actuation current needs to be configured, data registers and signal lines for generating and passing on the current values for further actuation currents which are otherwise required are no longer required.

In this case, the semiconductor switch is preferably in the form of a transistor with an insulated gate connection as control connection, in particular in the form of a power IGBT.

In one embodiment, the first steady-state switching state is an open switching state of the semiconductor switch and the second steady-state switching state is a closed switching state of the semiconductor switch, wherein the semiconductor switch is on in the closed switching state, i.e. conducts a current through a load path of the semiconductor switch, and is off in the open switching state, i.e. blocks the flow of current through the load path. Alternatively, the first steady-state switching state can be a closed switching state of the semiconductor switch and the second steady-state switching state can be an open switching state of the semiconductor switch.

In accordance with a further embodiment, in a first switching operation of the semiconductor switch from the open switching state to the closed switching state, a transition from the first switching phase to the second switching phase takes place depending on a first voltage, which is present between an input current connection and an output current connection of the semiconductor switch or on a parameter characterizing the first voltage.

In accordance with a further embodiment, in a second switching operation of the semiconductor switch from the closed switching state to the open switching state, a transition from the first switching phase to the second switching phase takes place depending on a second voltage, which is present between the control connection and the output current connection of the semiconductor switch or on a parameter characterizing the second voltage.

The two last-mentioned configurations provide the advantage that the semiconductor switch can be switched in controlled fashion on the basis of few parameters, which are already provided or are determined in any case for monitoring the switching response of the semiconductor switch. As a result, the controlled switching of the semiconductor switch takes place only with slight additional complexity.

In accordance with a further embodiment, the semiconductor switch is switched in a controlled manner to the open steady-state switching state by switching on a first controllable driver switch, wherein the first driver switch is switched on in current-controlled fashion in the first switching phase of the semiconductor switch by the at least one first actuation current, and is switched on in voltage-controlled fashion in the second switching phase of the semiconductor switch by the at least one first actuation voltage.

In accordance with a further embodiment, the semiconductor switch is switched in controlled fashion to the closed steady-state switching state by switching on a second controllable driver switch, wherein the second driver switch is switched on in current-controlled fashion in the first switching phase of the semiconductor switch by at least one third, predetermined actuation current, and is switched on in voltage-controlled fashion in the second switching phase of the semiconductor switch by at least one second actuation voltage.

In this case, the first and second driver switches can together form a half-bridge driver state, wherein the first driver switch can be arranged between the control connection of the semiconductor switch and a low-side supply voltage connection of the circuit arrangement, and the second driver switch can be arranged between the control connection of the semiconductor switch and a high-side supply voltage connection of the circuit arrangement.

In this case, the term "switch on" means a transition from an open steady-state switching state of the first or second driver switch to a closed steady-state switching state of the respective drive switch.

The first and second driver switches in this case each form a current drain or current source and enable currents with sufficient current intensities which contribute to rapid charge reversal of the capacitance of the control connection of the semiconductor switch and therefore rapid switching of the semiconductor switch.

In accordance with yet a further embodiment, a signal edge or a signal level is identified in the control signal. In addition, the first voltage and the second voltage are determined. The determined first voltage is then compared with a first reference voltage. Similarly, the determined second voltage is compared with a second reference voltage. Depending on the signal edge identified in the control signal or the signal level, the result of the comparison between the first voltage and the first reference voltage, and the result of the comparison between the second voltage and the second reference voltage, the semiconductor switch is then switched in current-controlled fashion in the first switching phase by the at least one first actuation current and/or in voltage-controlled fashion in the second switching phase by the at least one first actuation voltage.

In accordance with a further embodiment, the first driver switch is switched on in voltage-controlled fashion by the at least one first actuation voltage when a first signal edge or a first signal level of the control signal is present which indicates or animates switching of the semiconductor switch into the open switching state and when the second voltage undershoots the second reference voltage.

In accordance with a further embodiment, the second driver switch is switched on in voltage-controlled fashion by a second predetermined actuation voltage when a second signal edge or a second signal level of the control signal is present which indicates or animates switching of the semiconductor switch into the closed switching state and when the first voltage undershoots the first reference voltage.

In this case, the first signal edge of the control signal which indicates or animates switching of the semiconductor switch into the open switching state can be a falling signal edge. In this case, the second signal edge which indicates or animates switching of the semiconductor switch into the closed switching state is a rising signal edge. Alternatively, the first signal edge of the control signal can be a rising signal edge, and the second signal edge can be a falling signal edge. The control based on signal edges has the advantage that said signal edges can be identified using simple means. This again saves on complexity and costs.

In accordance with yet a further embodiment, the first driver switch is switched on in current-controlled fashion by the at least one first actuation current where the first signal edge or the first signal level of the control signal is present and when the second voltage overshoots the second reference voltage, and as long as the first voltage undershoots the first reference voltage.

In accordance with yet a further embodiment, the first driver switch is switched on in current-controlled fashion by a second predetermined actuation current, which is different, in particular lower, than the at least one first actuation current, when the first signal edge or the first signal level of the control signal is present and when the first voltage overshoots the first reference voltage and as long as the second voltage does not undershoot the second reference voltage.

By virtue of the first driver switch being switched on, a switch-off operation of the semiconductor switch from the closed steady-state switching state to the open steady-state switching state is initiated. For this purpose, the first driver switch and therefore the semiconductor switch are switched in current-controlled fashion by the first and second actuation currents, wherein the first actuation current is preferably greater in magnitude than the second actuation current. Therefore, the semiconductor switch is switched in current-controlled fashion in the first switching phase initially by the higher first actuation current and then by the lower second actuation current.

The switching operation can be shortened by the higher first actuation current, with the result that the switching losses can be reduced further. By virtue of the subsequent switching with the lower second actuation current, disruptive overvoltage peaks in the case of the first voltage between the input current connection and the output current connection of the semiconductor switch can be reduced.

In accordance with yet a further embodiment, the second driver switch is switched on in current-controlled fashion by the at least one third actuation current when the second signal edge or the second signal level of the control signal is present and when the first voltage overshoots the first reference voltage and as long as the second voltage undershoots the second reference voltage.

In accordance with yet a further embodiment, the second driver switch is switched on in current-controlled fashion by a fourth, predetermined actuation current which is different, in particular lower, than the third actuation current when the second signal edge or the second signal level of the control signal is present and when the second voltage overshoots the second reference voltage and as long as the first voltage does not undershoot the first reference voltage.

By switch-on of the second driver switch, a switch-on operation of the semiconductor switch from the open steady-state switching state to the closed steady-state switching state is initiated. In a similar manner too in the case of the first and second actuation currents, the third actuation current is preferably greater in magnitude than the fourth actuation current. Therefore, the semiconductor switch is switched in current-controlled fashion in the first switching phase initially by the higher third actuation current and then by the lower fourth actuation current. With the higher third actuation current, the switching operation can be shortened, with the result that the switching losses can be reduced further. By virtue of subsequent switching with the lower fourth actuation current, the rate of current change in the case of the current from the input current connection to the output current connection and therefore electromagnetic interference during the switch-on operation can be reduced.

Other embodiments provide a circuit arrangement for switching a semiconductor switch controllable via a control connection, in particular a power IGBT, from a first steady-state switching state to a second steady-state switching state by control of the control connection of the semiconductor switch is provided, wherein the circuit arrangement is designed to switch the semiconductor switch in current-controlled fashion in a first switching phase starting from the first steady-state switching state by impressing, in controlled fashion, at least one first, predetermined actuation current at the control connection of the semiconductor switch, and in voltage-controlled fashion in a second switching phase following the first switching phase by applying, in controlled fashion, at least one first, predetermined actuation voltage at the control connection of the semiconductor switch until the second steady-state switching state has been reached.

Other embodiments provide a power converter for providing at least one phase current for an electric machine comprising at least one semiconductor switch is provided, wherein the power converter has at least one above-described circuit arrangement, in particular in each case one circuit arrangement for each semiconductor switch, for switching the at least one semiconductor switch.

Other embodiments provide a drive apparatus for driving a vehicle, in particular an electric or hybrid vehicle, comprising an electric machine is provided, wherein the drive apparatus comprises a power converter for providing at least one phase current for the electric machine, which power converter has at least one semiconductor switch and at least one above-described circuit arrangement for switching the at least one semiconductor switch.

Advantageous configurations of the above-described method, insofar as they are transferable to the abovementioned circuit arrangement, the abovementioned power converter or the abovementioned drive apparatus, should also be considered to be advantageous configurations of the circuit arrangement, the power converter or the drive apparatus.

Reference is first made to FIG. 1, in which a drive apparatus AV comprising an electric machine EM and a power converter SR is illustrated in simplified and schematic form. This drive apparatus AV serves to drive an electric or hybrid vehicle not illustrated in the figure.

The electric machine EM is in the form of a synchronous machine, for example, and is mechanically coupled to a drive shaft (not illustrated in the figure) of the vehicle for torque transfer and is used for propulsion of the vehicle.

The power converter SR serves to provide phase currents Ip for the electric machine EM and is electrically connected to the electric machine EM via three current phases P1, P2 and P3.

The power converter SR comprises a triple half-bridge circuit DHS comprising in each case one high-side and one low-side semiconductor switch HS1 and HS2, HS3 and HS4 and HS5 and HS6, respectively, in each case in a series circuit. The six semiconductor switches HS1, HS2, HS3, HS4, HS5, HS6 in this embodiment are in the form of n-channel IGBTs (insulated-gate bipolar transistors) and each comprise a collector connection as an input current connection EHS, an emitter connection as an output current connection AHS and, between the input current connection EHS and the output current connection AHS, a load path for conducting a load current Io to the electric machine EM as phase current Ip.

The semiconductor switches HS1, HS2, HS3, HS4, HS5, HS6 furthermore each have a gate connection as a control connection SHS, via which the respective semiconductor switches HS1, HS2, HS3, HS4, HS5, HS6, by actuation, enable or block the throughflow of the respective load current Io through the respective load path (FIG. 1 shows, the input current connection EHS, the output current connection AHS and the control connection SHS only for a semiconductor switch HS1, by way of example, for ease of description).

With respect to each of these six semiconductor switches HS1, HS2, HS3, HS4, HS5, HS6, the power converter SR has in each case one circuit arrangement SA1, SA2, SA3, SA4, SA5, SA6 for controlling the respective semiconductor switch HS1, HS2, HS3, HS4, HS5, HS6, which circuit arrangements have largely the same functions as one another. In order to simplify the description of these circuit arrangements SA1, SA2, SA3, SA4, SA5, SA6, therefore, only one of these circuit arrangements SA1 is described in detail by way of example below.

In the same way as the remaining five circuit arrangements SA2, SA3, SA4, SA5, SA6, the circuit arrangement SA1 comprises a half-bridge driver stage HB as output stage for actuating the semiconductor switch HS1, a first comparison unit VE1, a second comparison unit VE2, a memory unit SE and an actuation unit AE for actuating the half-bridge driver stage HB.

The circuit arrangement SA1 is formed, with the exception of the half-bridge driver stage HB, in an ASIC module (ASIC: "Application-Specific Integrated Circuit"), i.e. in an integrated circuit.

The half-bridge driver stage HB for its part has in each case one first low-side driver switch T1 and one second high-side driver switch T2 in a series circuit, wherein the node between the two driver switches T1 and T2 which electrically connects these two driver switches T1 and T2 is electrically connected to the control connection SHS of the semiconductor switch HS1. As a result, the semiconductor switch HS1 is switched, i.e. opened and closed, controlled by these driver switches T1 and T2 of the half-bridge driver stage HB.

The two driver switches T1 and T2 each have a control connection ST1 and ST2 and are each designed such that they can be switched on and off in a controlled fashion via this control connection ST1 and ST2, respectively.

In this embodiment, the first driver switch T1 is in the form of an n-channel power MOSFET (power metal-oxide semiconductor field-effect transistor) comprising a gate connection as the control connection ST1, and the second driver switch T2 is in the form of a p-channel power MOSFET comprising a gate connection as the control connection ST2.

The first comparison unit VE1 has a first input connection E11 and a second input connection E12 as well as an output connection A11, and is electrically connected to the input current connection EHS of the semiconductor switch HS1 via the first input connection E11. Via this first input connection E11, the first comparison unit VE1 measures the voltage potential at the input current connection EHS of the semiconductor switch HS1 and thus determines a first voltage UE between the input current connection EHS and the output current connection AHS of the semiconductor switch HS1 or the collector-emitter voltage of the semiconductor switch HS1. The first comparison unit VE1 receives a first reference voltage UE_TH from the memory unit SE via the second input connection E12 and compares the first voltage UE with the first reference voltage UE_TH. Depending on the result of the comparison, the first comparison unit VE1 outputs a first output signal AS11 with corresponding signal levels at the output connection A11.

The second comparison unit VE2 likewise has a first input connection E21 and a second input connection E22 as well as an output connection A21 and is electrically connected to the control connection SHS of the semiconductor switch HS1 via the first input connection E21. Via this first input connection E21, the second comparison unit VE2 measures the voltage potential at the control connection SHS of the semiconductor switch HS1 and thus determines a second voltage US between the control connection SHS and the output current connection AHS or the gate-emitter voltage of the semiconductor switch HS1. The second comparison unit VE2 receives a second reference voltage US_TH from the memory unit SE via the second input connection E22 and compares the second voltage US with the second reference voltage US_TH and, depending on the result of the comparison, outputs a second output signal AS21 with corresponding signal levels at the output connection A21.

The actuation unit AE has a first input connection E31, a second input connection E32, a third input connection E33 and a fourth input connection E34, as well as a first output connection A31 and a second output connection A32. The actuation unit AE is electrically connected to the output connection A11 of the first comparison unit VE1 via the first input connection E31 and receives the first output signal AS11 from the first comparison unit VE1 via this first input connection E31. The actuation unit AE is electrically connected to the output connection A21 of the second comparison unit VE2 via the second input connection E32 and receives the second output signal AS21 from the second comparison unit VE2 via this second input connection E32. The actuation unit AE receives a pulse-width-modulated control signal PWM for controlling the semiconductor switch HS1 from a signal generator (not illustrated in the figure) via the third input connection E33. The actuation unit AE is electrically connected to an output connection A41 of the memory unit SE via the fourth input connection E34 and receives current values IAS10, IAS20, IAS30, IAS40 from the memory unit SE via this fourth input connection E34, with which current values the actuation unit AE switches the semiconductor switch HS1 in controlled fashion. The actuation unit AE is electrically connected to the control connection ST1 of the first, low-side driver switch T1 via the first output connection A31 and switches this driver switch T1 by means of a first actuation signal, which is impressed by the actuation unit AE via the first output connection A31 in the form of an actuation current at the control connection ST1 of this driver switch T1 or is applied by said actuation unit via said first output connection in the form of an actuation voltage at the control connection ST1 of this driver switch T1. Similarly, the actuation unit AE is electrically connected to the control connection ST2 of the second, high-side driver switch T2 via the second output connection A32 and switches this driver switch T2 by means of a second control signal, which is impressed by the actuation unit AE via the second output connection A32 in the form of an actuation current at the control connection ST2 of this driver switch T2 or is applied by said actuation unit via said second output connection in the form of an actuation voltage at the control connection ST2 of this driver switch T2.

The memory unit SE serves to store and provide voltage values of the reference voltages UE_TH, US_TH and current values IAS10, IAS20, IAS30, IAS40 for switching, in controlled fashion, the two driver switches T1 and T2 and therefore the semiconductor switch HS.

Figure 2:
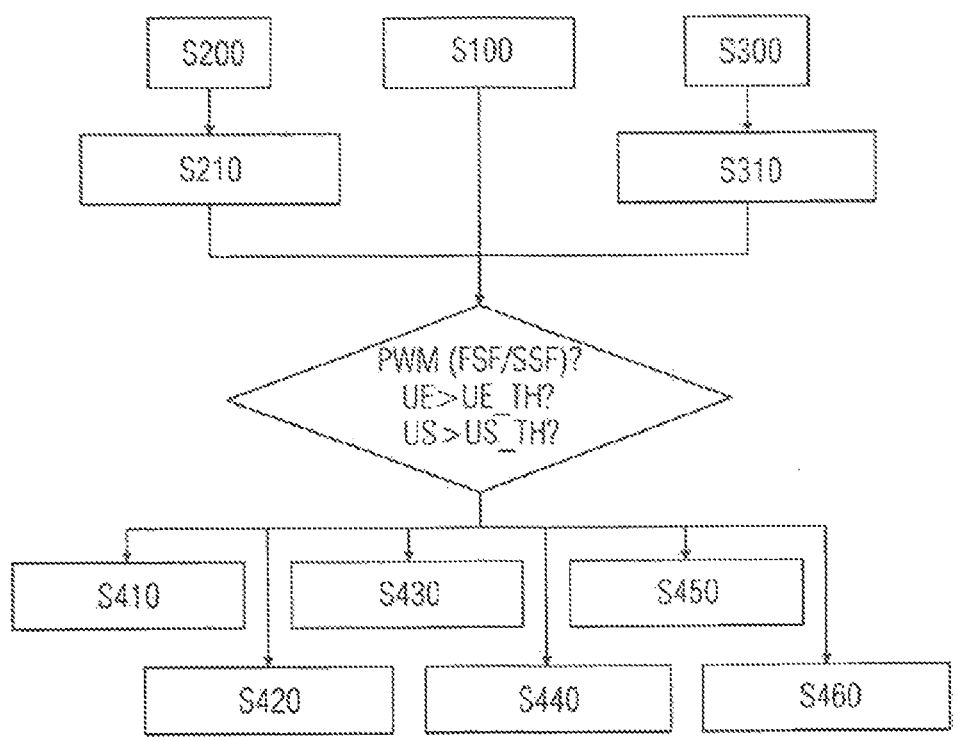
FIG. 2 shows a flowchart illustrating a method in accordance with one embodiment of the invention.
Figure 3:
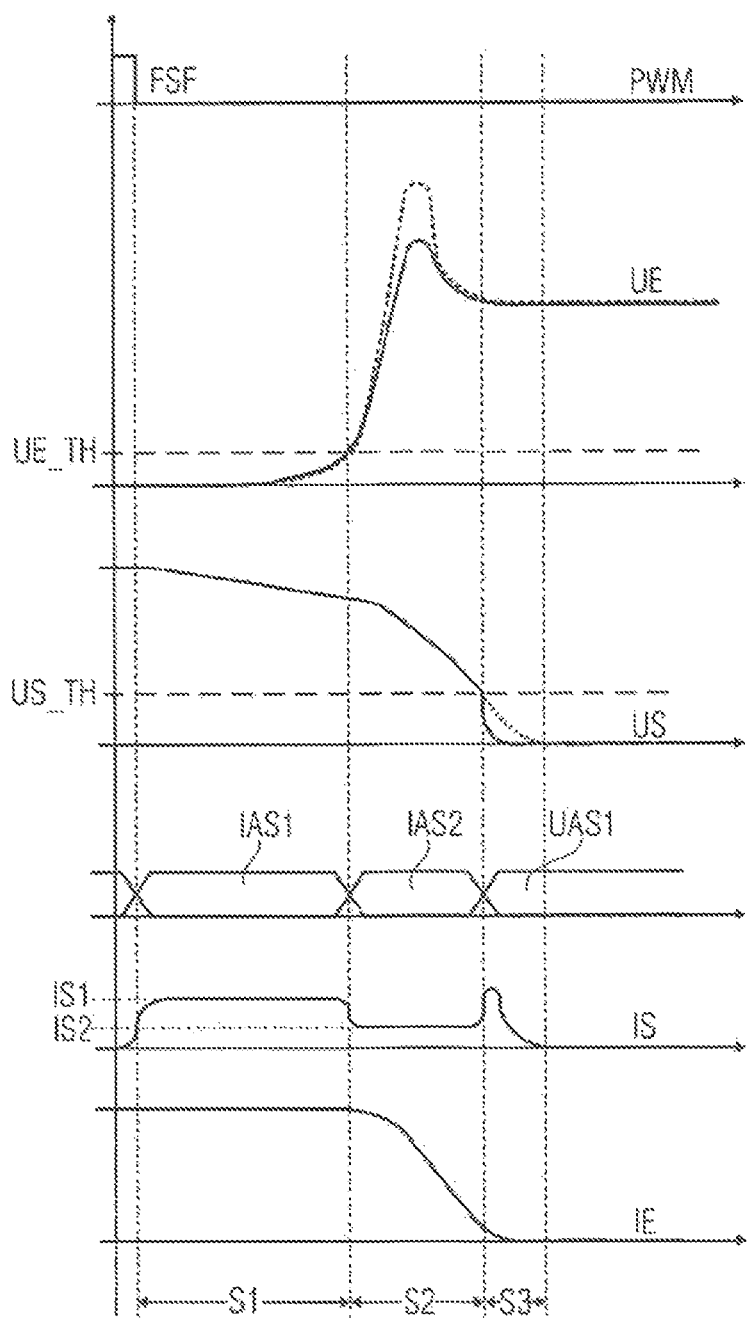
FIG. 3 shows a signal graph illustrating the method in accordance with the embodiment of the invention.

Since the exemplary embodiment of the circuit arrangement SA1 has been described in detail with the aid of FIG. 1, an exemplary method for switching the semiconductor switch HS1 using the circuit arrangement SA1 illustrated in FIG. 1 will now be described with the aid of FIGS. 2 and 3. In this case, FIG. 2 shows a sequence for the method for switching the semiconductor switch HS1 in a flowchart, and FIG. 3 shows corresponding signal and parameter changes during a switch-off operation of the semiconductor switch HS1 in a signal graph.

During operation of the drive apparatus AV, the electric machine EM is actuated by three pulse-width-modulated control signals, which switch on and off or close and open the six semiconductor switches HS1, HS2, HS3, HS4, HS5, HS6 in pairs, i.e. in each case two semiconductor switches HS1 and HS2, HS3 and HS4, or HS5 and HS6 of each of the three half-bridge circuits, with a phase shift and in edge-triggered fashion. The control operations of the respective semiconductor switches HS1, HS2, HS3, HS4, HS5, HS6 by these control signals take place via the respective circuit arrangements SA1, SA2, SA3, SA4, SA5, SA6 in an identical manner. Therefore, the method for switching the semiconductor switches HS1, HS2, HS3, HS4, HS5, HS6 by the respective circuit arrangements SA1, SA2, SA3, SA4, SA5, SA6 will be described below by way of example using the first semiconductor switch HS1 and the circuit arrangement SA1 assigned thereto.

During operation of the drive apparatus AV, the actuation unit AE of the circuit arrangement SA1 determines, in accordance with a first method step S100, a falling or rising signal edge FSF, SSF from the pulse-width-modulated control signal PWM.

In addition, the first comparison unit VE1 determines or measures, in accordance with a second method step S200, the first voltage UE at the input current connection EHS of the semiconductor switch HS1 based on the output current connection AHS of the semiconductor switch HS1. The first comparison unit VE1 compares the measured first voltage UE, in accordance with a third method step S210, with the first reference voltage UE_TH, whose voltage value is provided by the memory unit SE. The result of the comparison is then subsequently provided by the first comparison unit VE1 as the first output signal AS11 of the actuation unit AE.

Similarly, the second comparison unit VE2 determines or measures, in accordance with a fourth method step S300, the second voltage US at the control connection SHS of the semiconductor switch HS1 based on the output current connection AHS of the semiconductor switch HS1. The second comparison unit VE2 compares the measured second voltage US, in accordance with a fifth method step S310, with the second reference voltage US_TH, whose voltage value is likewise provided by the memory unit SE. The result of the comparison is then subsequently provided by the second comparison unit VE2 as the second output signal AS21 of the actuation unit AE.

Depending on the determined signal edge FSF, SSF of the control signal PWM, the first and second output signals AS11 and AS21 of the first and second comparison units VE1 and VE2, the actuation unit AE controls the first and second driver switches T1 and T2 and consequently the semiconductor switch HS1.

Specifically, the controlled switching of the semiconductor switch HS1 by the actuation unit AE takes place as described below.

In the case of an initially assumed closed steady-state starting switching state of the semiconductor switch HS1, said semiconductor switch is opened or brought into the open steady-state switching state stepwise in controlled fashion by the actuation unit AE in a switch-off operation (described below) in three temporally successive switching steps, i.e. in a first switching step S1, a second switching step S2 and a third switching step S3. In this case, the first and second switching steps S1 and S2 form the first current-controlled switching phase of the switch-off operation, and the third switching step S3 forms the second voltage-controlled switching phase of the switch-off operation of the semiconductor switch HS1.

If a falling signal edge FSF is present as a first signal edge of the control signal PWM which indicates switch-off, i.e. opening, of the semiconductor switch HS1, for example, or the actuation unit AE identifies a falling signal edge FSF in the case of the control signal PWM, the actuation unit AE in the case of the first and second output signals AS11 and AS21 of the first and second comparison units VE1 and VE2 checks whether the respective output signals AS11 and AS12 or the signal levels thereof indicate that the first reference voltage UE_TH has been undershot by the first voltage UE, and at the same time that the second reference voltage US_TH has been overshot by the second voltage US, i.e. whether the following two equations hold true: UE<UE_TH and US>US_TH.

If this is the case, the actuation unit AE, in accordance with a sixth method step S410, generates a first constant actuation current IAS1 from the first current value IAS10 of the memory unit SE and impresses this first actuation current IAS1 at the control connection ST1 of the first driver switch T1. Actuated by this first actuation current IAS1, the first driver switch T1 is switched on or closed in the first switching step S1. The first driver switch T1 in the process increases the first actuation current IAS1 to a first constant gate current IS1 (see FIG. 4), which now flows away from the control connection SHS of the semiconductor switch HS1 in this first switching step S1. As a result, the first driver switch T1 forms a current drain for discharging the input capacitance of the control connection SHS of the semiconductor switch HS1. As a result, the control connection SHS of the semiconductor switch HS1 is discharged, and the second voltage US or the gate-emitter voltage of the semiconductor switch HS1 decreases. As a result, the first voltage UE or the collector-emitter voltage of the semiconductor switch HS1 increases and the collector-emitter current IE decreases. The first driver switch T1 or the semiconductor switch HS1 is switched further in current-controlled fashion by the first actuation current IAS1 in this first switching step S1 as long as the first voltage UE does not overshoot the first reference voltage UE_TH, i.e. as long as the following equation holds true: UE<UE_TH.

The rising first voltage UE is furthermore measured by the first comparison unit VE1 and compared with the first reference voltage UE_TH. As soon as the first voltage UE overshoots the first reference voltage UE_TH, the first comparison unit VE1 changes the signal level of the first output signal AS11. The actuation unit AE identifies this level change in the case of the first output signal AS11 and thereupon generates, in accordance with a seventh method step S420, a second constant actuation current IAS2 from the second current value IAS20 of the memory unit SE and impresses this second actuation current IAS2 at the control connection ST1 of the first driver switch T1. Actuated by this second actuation current IAS2, the first driver switch T1, in the second switching step S2, is further switched on or closed. The first driver switch T1 in the process increases the second actuation current IAS2 to a second constant gate current IS2 (see FIG. 4), which now, in this second switching step S2, flows away from the control connection SHS of the semiconductor switch HS1. As a result, the control connection SHS of the semiconductor switch HS1 discharges further and the second voltage US of the semiconductor switch HS1 decreases further. As a result, the first voltage UE of the semiconductor switch HS1 increases further and the collector-emitter current IE decreases further. The first driver circuit T1 or the semiconductor switch HS1 is switched further in current-controlled fashion by the second actuation current IAS2 in this second switching step S2 as long as the second voltage US overshoots the second reference voltage US_TH, i.e. as long as the following equation holds true: US>US_TH.

In this case, the second current value IAS20 or the second actuation current IAS2 is preset in such a way that said value or said current is less than or lower than the first current value IAS10 or the first actuation current IAS1. As a result, the first driver switch T1 switches off a or the semiconductor switch HS1 more quickly in the first switching step S1 than in the second switching step S2. By virtue of the fast switching-off of the semiconductor switch HS1 in the first switching step S1, the energy from switching losses in the case of the first driver switch T1 and the semiconductor switch HS1 is reduced and the entire switching duration is also shortened. By virtue of the subsequent slow switchon of the first driver switch T1 and the slow switchoff of the semiconductor switch HS1 by the lower second actuation current IS2 in the subsequent second switching step S2, the overvoltage peaks occurring in this second switching step S2 in the case of the second voltage UE or the collector-emitter voltage can be limited to a voltage value which is unhazardous to the semiconductor switch HS1.

The falling second voltage US or the gate-emitter voltage of the semiconductor switch HS1 is furthermore measured by the second comparison unit VE2 and compared with the second reference voltage US_TH. As soon as the second voltage UE undershoots the second reference voltage US_TH, the second comparison unit VE2 changes the signal level of the second output signal AS21. The actuation unit AE identifies this level change in the case of the second output signal AS21 and thereupon, in accordance with an eighth method step S430, connects the control connection ST1 of the first driver switch T1 to a first predetermined actuation voltage UAS1 based on the voltage potential at a negative supply voltage connection NA of the circuit arrangement SA1. Controlled by this first actuation voltage UAS1, the first driver switch T1 now switches on completely in the third switching step S3. As a result, the second voltage US or the gate-emitter voltage is brought sharply in a short period of time to the voltage potential at the negative supply voltage connection NA, and the semiconductor switch HS1 is opened completely or brought into an open steady-state switching state. Owing to the fast change in the second voltage US, the energy from switching losses is further reduced and the total switching duration in the case of the semiconductor switch HS1 is further shortened.

The first driver switch T1 is then further held in this closed switching state by the first actuation voltage UAS1 until a next signal edge is identified in the control signal PWM. As long as the first driver switch T1 is held in the closed switching state by the first actuation voltage UAS1, the semiconductor switch HS1 remains in the open steady-state switching state.

During this switchoff operation of the semiconductor switch HS1, the second driver switch T2 is switched off or brought into an open switching state and held there in current-controlled and/or voltage-controlled fashion in a simple switching method known to a person skilled in the art.

Starting from the open switching state, the semiconductor switch HS1 is likewise closed or brought into the closed steady-state switching state stepwise in a switch-on operation described below, likewise in three switching steps, i.e. in a first switching step S4, a second switching step S5 and a third switching step S6. In this case, the first and second switching steps S4 and S5 form the first current-controlled switching phase of the switch-on operation of the semiconductor switch HS1, and the third switching step S6 forms the second voltage-controlled switching phase of the switch-on operation.

If a rising signal edge SFF is present as a second signal edge of the control signal PWM, which indicates switch-on, i.e. closing, of the semiconductor switch HS1, for example, or the actuation unit AE identifies a rising signal edge SSF in the case of the control signal PWM, it checks, in the case of the first and second output signals AS11 and AS21, whether the respective output signals AS11 and AS21 or the signal levels thereof indicate that the first reference voltage UE_TH is overshot by the first voltage UE and at the same time that the second reference voltage US_TH is undershot by the second voltage US, i.e. whether the following two equations hold true: UE>UE_TH and US<US_TH.

If this is the case, the actuation unit AE, in accordance with a ninth method step S440, generates a third constant actuation current IAS3 with the third current value IAS30 of the memory unit SE and impresses this third actuation current IAS3 at the control connection ST2 of the second driver switch T2 via the second output connection A32. Actuated by this third actuation current IAS3, the second driver switch T2 is switched on or closed in the first switching step S4. The second driver switch T2 in the process increases the third actuation current IAS3 to a third constant gate current, which now, in this first switching step S4, flows to the control connection SHS of the semiconductor switch HS1. As a result, the second driver switch T2 forms a current source for charging the input capacitance of the control connection SHS of the semiconductor switch HS1. As a result, the control connection SHS of the semiconductor switch HS1 is charged, and the second voltage US or the gate-emitter voltage of the semiconductor switch HS1 increases. As a result, the first voltage UE or the collector-emitter voltage of the semiconductor switch HS1 decreases, and the collector-emitter current increases. The second driver switch T2 or the semiconductor switch HS1 is switched further in current-controlled fashion by the third actuation current IAS3 in this first switching step S4 as long as the second voltage US does not overshoot the second reference voltage US_TH, i.e. as long as the following equation holds true: US<US_TH.

The rising second voltage US is furthermore measured by the second comparison unit VE2 and compared with the second reference voltage US_TH. As soon as the second voltage US overshoots the second reference voltage US_TH, the second comparison unit VE2 changes the signal level of the second output signal AS21. The actuation unit AE identifies this level change in the case of the second output signal AS21 and thereupon generates, in accordance with a tenth method step S450, a fourth constant actuation current IAS4 with a fourth current value IAS40 from the memory unit SE, which is then impressed at the control connection ST2 of the second driver circuit T2 via the second output connection A32 of the actuation unit AE. Actuated by this fourth actuation current IAS4, the second driver switch T2 is switched on or closed further in the second switching step S5. The second driver circuit T2 in the process increases the fourth actuation current IAS4 to a fourth constant gate current, which now, in this second switching step S5, flows to the control connection SHS of the semiconductor switch HS1. As a result, the control connection SHS of the semiconductor switch HS1 charges further and the second voltage US of the semiconductor switch HS1 increases further. As a result, the first voltage UE of the semiconductor switch HS1 decreases further and the collector-emitter current increases further. The second driver switch T2 or the semiconductor switch HS1 is switched further in current-controlled fashion by the fourth actuation current IAS4 in this second switching step S5 as long as the first voltage UE overshoots the first reference voltage UE_TH, i.e. as long as the following equation holds true: UE>UE_TH.

In this case, the fourth current value IAS40 or the fourth actuation current IAS4 is preset in such a way that said current value or current is less or lower than the third current value IAS30 or the third actuation current IAS3. As a result, the second driver switch T2 or the semiconductor switch HS1 switches on more quickly in the first switching step S4 than in the second switching step S5. By virtue of the fast switchon of the second driver switch T2 and the semiconductor switch HS1 in the first switching step S4, the switching losses in the case of the second driver switch T2 and the semiconductor switch HS1 are reduced in this switching step. By virtue of the subsequent slow switchon of the second driver switch T2 and the semiconductor switch HS1 by the lower second actuation current IAS5 in the subsequent second switching step S5, the rate of current change in the collector-emitter current, i.e. the current from the input current connection EHS to the output current connection AHS of the semiconductor switch HS1, can be limited. As a result, electromagnetic interference is reduced or avoided.

The falling first voltage UE is furthermore measured by the first comparison unit VE1 and compared with the first reference voltage UE_TH. As soon as the first voltage US undershoots the first reference voltage UE_TH, the first comparison unit VE1 changes the signal level of the first output signal AS11. The actuation unit AE identifies this level change in the first output signal AS11 and thereupon, in accordance with an eleventh method step S460, applies a second constant actuation voltage UAS2 at the control connection ST2 of the second driver switch T2 (based on the voltage potential at the negative supply voltage connection NA of the circuit arrangement SA1). Controlled by this second actuation voltage UAS2, the second driver switch T2 now switches on completely in the third switching state S3. As a result, the second voltage US or the gate-emitter voltage is drawn to the voltage value of the operating voltage of the electric machine EM in a short period of time, and the semiconductor switch HS1 is completely closed or brought into the closed steady-state switching state.

The second driver switch T2 is then held further in this closed switching state by the second actuation voltage UAS2 until a subsequent signal edge in the control signal PWM is identified. As long as the second driver switch T2 is held in this closed switching state by the second actuation voltage UAS2, the semiconductor switch HS1 remains in the closed steady-state switching state. By virtue of the fast change in the second voltage US or the gate-emitter voltage of the semiconductor switch HS1, the switching losses are reduced further, and also the total switching duration in the case of the semiconductor switch HS1 is shortened further.

In this switch-on operation of the semiconductor switch HS1, the first driver switch T1 is switched off or brought into an open switching state and held there in current-controlled and/or voltage-controlled fashion in a simple switching operation which is known to a person skilled in the art.

By way of summary, the current-controlled and voltage-controlled switching of the semiconductor switch HS1 therefore takes place as illustrated in Table 1 below.

TABLE 1

| Switching operation | Switching steps | PWM | UE > UE_TH | US > US_TH | T1 | T2 |
|---|---|---|---|---|---|---|
| Switch off HS1 | S1 | FSF | 0 | 1 | IAS1 | — |
|  | S2 | FSF | 1 | 1 | IAS2 | — |
|  | S3 | FSF | 1 | 0 | UAS1 | — |
| Switch on HS1 | S4 | SSF | 1 | 0 | — | IAS3 |
|  | S5 | SSF | 1 | 1 | — | IAS4 |
|  | S6 | SSF | 0 | 1 | — | UAS2 |

What is claimed is:

1. A method for switching a semiconductor switch from a first steady-state switching state to a second steady-state switching state by controlling a control connection of the semiconductor switch the method comprising:
   in a first switching stage, applying, in a controlled manner, at least one first, predetermined actuation current at the control connection of the semiconductor switch to provide current-controlled switching of the semiconductor switch starting from the first steady-state switching state in a first switching phase, and
   in a second switching phase following the first switching phase, applying, in a controlled manner, at least one first, predetermined actuation voltage at the control connection of the semiconductor switch to provide voltage-controlled switching of the semiconductor switch until the second steady-state switching state has been reached
   either (a) the first steady-state switching state is an open switching state of the semiconductor switch, and the second steady-state switching state is a closed switching state of the semiconductor switch, or (b) the first steady-state switching state is a closed switching state of the semiconductor switch and the second steady-state switching state is an open switching state of the semiconductor switch, and
   the semiconductor switch is on in the closed switching state, and the semiconductor switch is off in the open switching state.

2. The method of claim 1, wherein in a first switching operation of the semiconductor switch from the open switching state to the closed switching state, a transition from the first switching phase to the second switching phase occurs depending on (a) a voltage present between an input current connection and an output current connection of the semiconductor switch or (b) a parameter characterizing the first voltage (UE).

3. The method of claim 1, wherein in a second switching operation of the semiconductor switch from the closed switching state to the open switching state, a transition from the first switching phase to the second switching phase occurs depending on (a) a voltage present between the control connection and the output current connection of the semiconductor switch or (b) a parameter characterizing the second voltage.

4. The method of claim 1, wherein the semiconductor switch is switched in a controlled manner to the open steady-state switching state by switching on a first controllable driver switch, and wherein the first driver switch:
(a) is switched on in current-controlled fashion in the first switching phase of the semiconductor switch by the at least one first actuation current, and
(b) is switched on in voltage-controlled fashion in the second switching phase of the semiconductor switch by the at least one first actuation voltage.

5. The method of claim 1, wherein the semiconductor switch is switched in controlled fashion to the closed steady-state switching state by switching on a second controllable driver switch, and
wherein the second driver switch:
(a) is switched on in current-controlled fashion in the first switching phase of the semiconductor switch by at least one third, predetermined actuation current, and
(b) is switched on in voltage-controlled fashion in the second switching phase of the semiconductor switch by at least one second, predetermined actuation voltage.

6. The method of claim 4, comprising switching-on of the first driver switch by the at least one first actuation voltage:
(a) in response to the presence of a first signal edge or a first signal level of the control signal for switching the semiconductor switch into the open switching state, and
(b) in response to the second reference voltage being undershot by the second voltage.

7. The method of claim 6, comprising switching-on of the second driver switch by the second actuation voltage:
(a) in response to the presence of a second signal edge or of a second signal level of the control signal for switching the semiconductor switch into the closed switching state, and
(b) in response to the first reference voltage being undershot by the first voltage.

8. The method of claim 4, comprising switching-on of the first driver switch by the at least one first actuation current:
(a) in response to the presence of the first signal edge or the first signal level of the control signal,
(b) in response to the second reference voltage being overshot by the second voltage, and
(c) as long as the first voltage undershoots the first reference voltage.

9. The method of claim 8, comprising switching-on of the first driver switch by a second, predetermined actuation current which is lower than the at least one first actuation current:
(a) in response to the presence of the first signal edge or the first signal level of the control signal,
(b) in response to the first reference voltage being overshot by the first voltage, and
(c) as long as the second voltage does not undershoot the second reference voltage.

10. The method of claim 9, comprising switching-on of the second driver switch by the at least one third actuation current:
(a) in response to the presence of the second signal edge or the second signal level of the control signal,
(b) in response to the first reference voltage being overshot by the first voltage, and
(c) as long as the second voltage undershoots the second reference voltage.

11. The method of claim 10, comprising switching-on of the second driver switch by a fourth, predetermined actuation current which is lower, than the at least one third actuation current
(a) in response to the presence of the second signal edge or the second signal level of the control signal,
(b) in response to the second reference voltage being overshot by the second voltage, and
(c) as long as the first voltage does not undershoot the first reference voltage.

12. A circuit arrangement for switching a semiconductor switch controllable via a control connection from a first steady-state switching state to a second steady-state switching state by controlling the control connection of the semiconductor switch, wherein:
the circuit arrangement is configured to switch the semiconductor switch in current-controlled fashion starting from the first steady-state switching state in a first switching phase by applying, in controlled fashion, at least one first, predetermined actuation current at the control connection of the semiconductor switch, and
the circuit arrangement is configured to switch the semiconductor switch in voltage-controlled fashion in a second switching phase following the first switching phase by applying, in controlled fashion, at least one first, predetermined actuation voltage at the control connection of the semiconductor switch until the second steady-state switching state has been reached,
wherein either (a) the first steady-state switching state is an open switching state of the semiconductor switch, and the second steady-state switching state is a closed switching state of the semiconductor switch, or (b) the first steady-state switching state is a closed switching state of the semiconductor switch and the second steady-state switching state is an open switching state of the semiconductor switch, and
the semiconductor switch is on in the closed switching state, and the semiconductor switch is off in the open switching state.

13. A power converter for providing at least one phase current for an electric machine comprising at least one semiconductor switch, wherein the power converter comprises:
at least one circuit arrangement for switching the at least one semiconductor switch,
wherein each circuit arrangement is configured to:
switch the semiconductor switch in current-controlled fashion starting from the first steady-state switching state in a first switching phase by applying, in controlled fashion, at least one first, predetermined actuation current at the control connection of the semiconductor switch, and
switch the semiconductor switch in voltage-controlled fashion in a second switching phase following the first switching phase by applying, in controlled fashion, at least one first, predetermined actuation voltage at the control connection of the semiconductor switch until the second steady-state switching state has been reached, and
wherein either (a) the first steady-state switching state is an open switching state of the semiconductor switch, and the second steady-state switching state is a closed switching state of the semiconductor switch, or (b) the first steady-state switching state is a closed switching state of the semiconductor switch and the second steady-state switching state is an open switching state of the semiconductor switch, and
the semiconductor switch is on in the closed switching state, and the semiconductor switch is off in the open switching state.

* * * * *